(12) United States Patent
Zhang et al.

(10) Patent No.: US 11,979,025 B2
(45) Date of Patent: May 7, 2024

(54) DUAL-MODE COMBINED CONTROL METHOD FOR MULTI-INVERTER SYSTEM BASED ON DOUBLE SPLIT TRANSFORMER

(71) Applicant: HEFEI UNIVERSITY OF TECHNOLOGY, Hefei (CN)

(72) Inventors: Xing Zhang, Hefei (CN); Ming Li, Hefei (CN); Zixuan Guo, Hefei (CN); Jilei Wang, Hefei (CN); Hailong Pan, Hefei (CN); Yang Wang, Hefei (CN); Qian Gao, Hefei (CN); Fei Li, Hefei (CN)

(73) Assignee: HEFEI UNIVERSITY OF TECHNOLOGY, Hefei (CN)

( * ) Notice: Subject to any disclaimer, the term of this patent is extended or adjusted under 35 U.S.C. 154(b) by 241 days.

(21) Appl. No.: 17/764,210

(22) PCT Filed: May 13, 2021

(86) PCT No.: PCT/CN2021/093505
§ 371 (c)(1),
(2) Date: Mar. 28, 2022

(87) PCT Pub. No.: WO2021/233190
PCT Pub. Date: Nov. 25, 2021

(65) Prior Publication Data
US 2022/0352726 A1      Nov. 3, 2022

(30) Foreign Application Priority Data

May 21, 2020   (CN) .................. 202010434737.X (51) Int. Cl.
*H02J 3/46*      (2006.01)
*G06F 17/14*    (2006.01)
*H02J 3/38*      (2006.01)

(52) U.S. Cl.
CPC ................ *H02J 3/46* (2013.01); *G06F 17/14* (2013.01); *H02J 2300/24* (2020.01)

(58) Field of Classification Search
CPC . H02J 3/46; H02J 2300/24; H02J 3/38; G06F 17/14
See application file for complete search history.

(56) References Cited

FOREIGN PATENT DOCUMENTS

| CN | 105356507 A | 2/2016 |
|---|---|---|
| CN | 108039729 A | 5/2018 |

(Continued)

OTHER PUBLICATIONS

Translation CN 108933447.*

(Continued)

*Primary Examiner* — Thienvu V Tran
*Assistant Examiner* — Yahveh Comas Torres
(74) *Attorney, Agent, or Firm* — Bayramoglu Law Offices LLC (57) ABSTRACT

A dual-mode combined control method for a multi-inverter system based on a double split transformer is provided. For an extremely-weak grid, the method provides the dual-mode combined control method for a multi-inverter system based on a double split transformer. According to the method, the equivalent grid impedance at a point of common coupling (PCC) of one grid-connected inverter (GCI) in the multi-inverter system based on the double split transformer is obtained with a grid impedance identification algorithm, and the system sequentially operates in a full current source mode, a hybrid mode, and a full voltage source mode according to a gradually increasing equivalent grid impedance, thereby effectively improving the stability of the multi-inverter system based on the double split transformer (Continued)

during variation of the strength of the grid. The method ensures that the system can still operate stably in the extremely-weak grid.

3 Claims, 6 Drawing Sheets

(56) References Cited

FOREIGN PATENT DOCUMENTS

| | | | | |
|---|---|---|---|---|
| CN | 108933447 A | * | 12/2018 | ............ H02J 3/38 |
| CN | 108933447 A | | 12/2018 | |
| CN | 110021959 A | | 7/2019 | |
| CN | 111769591 A | | 10/2020 | |
| EP | 3637574 A1 | | 4/2020 | |

OTHER PUBLICATIONS

Li, Ming, "Research on Impedance Adaptive Dual-Mode Control of the Grid-Connected Inverter for High-Penetration New Energy Generation", China Doctoral Dissertations Full-Text Database, (Electronic Journals), Engineering Science & Technology), No. 1, Jan. 15, 2021 (Jan. 15, 2021), ISSN: 1674-022X, chapter 2, chapter 5.

Sun Li et al. "Research on Control Strategy of Independent Power Supply Stability of Double Mode Inverter", Computer Simulation, No. 8, vol. 34, 2017, p. 128-132.

Li Xiang et al. "Research on Control of Dual-mode Inverter in Unbalanced Conditions of Power Grid and Loads", Electrical Application, No. 6, vol. 37, 2018, p. 34-40.

Li Ming et al. "The Grid Impedance Adaptation Dual Mode Control Strategy in Weak Grid", 2018 International Power Electronics Conference ECCE Asia (IPEC-ECCE Asia), 2018: 2973-2979.

Li Ming et al. "A Novel Stability Improvement Strategy for a Multi-Inverter System in aWeak Grid Utilizing Dual-Mode Control", Energies, 2018, 11(8):2144.

* cited by examiner

DUAL-MODE COMBINED CONTROL METHOD FOR MULTI-INVERTER SYSTEM BASED ON DOUBLE SPLIT TRANSFORMER

CROSS REFERENCE TO THE RELATED APPLICATIONS

This application is the national phase entry of International Application No. PCT/CN2021/093505, filed on May 13, 2021, which is based upon and claims priority to Chinese Patent Application No. 202010434737.X, filed on May 21, 2020, the entire contents of which are incorporated herein by reference.

TECHNICAL FIELD

The present invention relates to a control method for a multi-inverter system based on a double split transformer, particularly relates to a dual-mode combined control method for a multi-inverter system based on a double split transformer, and belongs to the field of electrical engineering.

BACKGROUND

Ongoing efforts have been made throughout the world to exploit and utilize renewable energy resources such as wind energy and solar energy. Particularly in China, The United States and India, etc., large-scale desert photovoltaic power stations above MW levels have been set up and put into operation, and the penetration rate of renewable energy power generation is increasingly higher. For desert power stations with open fields, centralized photovoltaic power generation systems have been widely applied due to their simple structures, high efficiency, and easy maintenance, etc.; and it is crucial in the whole photovoltaic power generation systems to connect photovoltaic grid-connected inverters (GCIs) in the large-scale photovoltaic power stations to box-type transformer substations. With certain practical economic significances for saving the investment costs and the occupied area, the multi-inverter system based on a double split transformer has become a standard design solution of the large-scale photovoltaic power plants. However, for the centralized photovoltaic power generation systems with a high penetration rate, multiple centralized high-power photovoltaic GCIs are mostly connected; and through long-distance transmission lines and transformers, the systems are interconnected and connected to a public grid. As a result, the systems will present characteristics of weak grids or extremely-weak grids with high grid impedance; and curtailment of wind and photovoltaic power generation, and power grid faults will occur frequently to seriously affect the safety and stability operation of the power grids and renewable energy power generation systems or even cause system faults of the power grids. Because of periodicity, randomness, and output power fluctuation of the renewable energy power generation such as wind power and photovoltaic power, the equivalent grid impedance of the systems will be fluctuated largely, such that the power grids exhibit variation characteristics of strong and weak grids to pose a severe challenge to the stable operation of the multi-inverter system based on the double split transformer controlled with the conventional single current source mode.

Recently, intensive theoretical analysis has been made on stability control methods of GCIs in weak grids or extremely-weak grids in both academic papers and practical engineering applications. Existing concepts of dual-mode control include not only the "grid-connected mode/islanded mode", but also the "current source mode/voltage source mode". However, the dual-mode control based on the "grid-connected mode/islanded mode" cannot address the stability problem of the GCIs in the weak grids or extremely-weak grids, for example:

1) In the paper "*Research on Control Strategy of Independent Power Supply Stability of Dual-mode Inverter*" presented by Li SUN and Enrang ZHENG on Computer Simulation, no. 8, vol. 34, 2017, the control solution of the grid-connected/stand-alone dual-mode inverter in a micro-grid is provided. According to this solution, the quasi-proportional-resonant (QPR) control and the proportional complex integral (PCI) control are introduced into the droop control. The two control algorithms in the $\alpha\beta$-coordinate system do not need decoupling, thus effectively suppressing voltage fluctuation. The dual-mode control in this paper focuses on the grid-connected and stand-alone conditions of the inverter, rather than the mode switching of the GCI between the current source mode and the voltage source mode as the grid impedance changes.

2) In the paper "*Research on Control of Dual-mode Inverter in Unbalanced Conditions of Power Grid and Loads*" presented by Xiang LI, Qingguang LI, and Ninghui ZHU et al. on Electrical Application, no. 6, vol. 37, 2018, with investigations on the control of the dual-mode inverter in unbalanced conditions of loads and the power grid, a method for extracting positive- and negative-sequence components for voltages of the inverter in grid-connected and stand-alone conditions is provided, to quickly track how the power grid with unbalanced voltages changes, thereby eliminating effects of the unbalanced power grid on the inverter. However, neither the influences of weak grid scenarios due to the grid impedance on the stability of the inverter nor the dual-mode switching of the multi-inverter system between the current source mode and the voltage source mode are mentioned in this paper.

Given this, there have been works of literature to support a statement that the dual-mode control based on the "current source mode/voltage source mode", though making the single inverter in the weak grid more stable, does not involve the stability problem of the multi-inverter system. For example:

1) According to the literature "*The Grid Impedance Adaptation Dual Mode Control Strategy in Weak Grid*" presented by Ming LI and Xing ZHANG et al. on the 2018 International Power Electronics Conference ECCE Asia (IPEC-ECCE Asia), 2018: 2973-2979, aiming at main stability control strategies in the weak grid, i.e., the current source mode and the voltage source mode, analyzing the monotonicity in power transmission of the GCI in this two modes respectively. Meanwhile, with the small-signal modeling and analysis on the voltage source mode controlled inverter, the results indicate that the inverter operating in the voltage source mode is more stable as the grid impedance increases. However, this paper focuses on the switching of the single inverter between the current source mode and the voltage source mode and does not involve the stability issue when the dual-mode control is applied into the multi-inverter system based on the double split transformer.

2) The Chinese patent application CN 105356507 B discloses a dual-mode adaptive control method for the LC-typed GCI based on a grid impedance on Aug. 29, 2017. By identifying the grid impedance, setting a grid impedance boundary value for switching the control mode for inverter between the current source mode and the voltage source mode, i.e., controlling the inverter with the current source mode when the grid impedance is smaller than the switching boundary value, and controlling the inverter with the voltage source mode when the grid impedance is larger than the switching boundary value. This issued patent combines with the advantages of the two grid-connected modes, and it overcomes the disadvantage that the inverter can only operate stably within a relatively small variation range of the grid impedance when the inverter operates in the single current source mode or voltage source mode under different grid impedance. However, this patent focuses on the switching of the single inverter between the current source mode and the voltage source mode, and does not involve the stability issue when the dual-mode control is extended to the multi-inverter system based on the double split transformer.

Therefore, there have been works of literature to further provide a solution for extending the dual-mode control based on the "current source mode/voltage source mode" from the single-inverter system to the multi-inverter system and switching the multi-inverter system from operating in the full current source mode to the hybrid mode, namely providing the GCIs in both the current source mode and voltage source mode for the system, thus effectively improving the stability of the multi-inverter system in the weak grid. Nevertheless, there are no descriptions made on whether the hybrid mode keeps the system stable when the power grid becomes extremely weak (namely the extremely-weak grid) in the existing literature. For example:

1) According to the literature "*A Novel Stability Improvement Strategy for a Multi-Inverter System in a Weak Grid Utilizing Dual-Mode Control*" presented by Ming LI, Xing ZHANG and Wei ZHAO, Energies, 2018, 11(8):2144, by applying the dual-mode control based on the "current source mode/voltage source mode" to the multi-inverter system, and switching the multi-inverter system from operating in the full current source mode to the hybrid mode, i.e., providing the GCIs in both the current source mode and voltage source mode for the system, the stability of the multi-inverter system in the weak grid can be effectively improved. Nevertheless, there are no descriptions made on whether the hybrid mode keeps the system stable when the power grid becomes extremely weak (namely the extremely-weak grid).

2) The Chinese patent application CN 108039729 A discloses a stability control method for a multi-inverter system based on mode adaptation in a weak grid on May 15, 2018. By obtaining an equivalent grid impedance at the point of common coupling (PCC) of a GCI in the multi-inverter system with a grid impedance identification algorithm, and switching rest GCIs in the multi-inverter system one by one to operate in the voltage source mode when a value is greater than a set boundary value of equivalent grid impedance. This invention greatly improves the stability margin of the multi-inverter system in the weak grid, and makes this system more adaptable to the power grid. Nevertheless, there are still no descriptions made on whether the hybrid mode keeps the system stable when the power grid becomes extremely weak (namely the extremely-weak grid).

3) The Chinese patent application CN 108933447 A discloses a parameter adaptive control method for a multi-inverter system based on mode switching in a weak grid on Dec. 4, 2018. For the disadvantage that the multi-inverter system operated in the full current source mode under the weak grid typically improves the stability by reducing the gain of the current regulator for the GCIs at the sacrifice of the dynamic performance, the parameter adaptive control method for a multi-inverter system based on mode switching in a weak grid is provided in this patent. By switching a part of GCIs in the multi-inverter system to operating in the voltage source mode, and adaptively increasing the gain of the current regulator for the GCIs still operating in the current source mode, this invention ensures the stability of the system and further improves the dynamic performance of the GCIs compared with the multi-inverter system operated in the full current source mode. Nevertheless, there are still no descriptions made on whether the hybrid mode keeps the system stable when the power grid becomes extremely weak (namely the extremely-weak grid).

4) The Chinese patent application CN 108933447 A discloses a dual-mode control method for a GCI based on the short-circuit ratio in a weak grid on Jul. 16, 2019. To improve the stability of a multi-inverter system operated in the full current source mode under the weak grid, the power grid impedance identification method is usually used to adjust the control parameters or grid-connected mode. However, because the characteristics of the weak grid are often directly related to the short-circuit ratio, this invention proposes the dual-mode control method for the GCI based on the short-circuit ratio in a weak grid to solve the problem that the grid impedance is not enough intuitive and clear to describe the state of the weak grid in conventional solutions in the prior art. Since the method for detecting the equivalent short-circuit ratio of the system can reflect the state of the weak grid accurately and intuitively, this invention provides a basis for switching the GCIs between the current source mode and the voltage source mode, thereby ensuring the stable operation of the GCIs, and greatly improves the grid-connected quality of the GCIs. Nevertheless, there are still no descriptions made on whether the hybrid mode keeps the system stable when the power grid becomes extremely weak (namely the extremely-weak grid).

In conclusion, there have been the following problems in the prior art:

(1) Prior dual-mode control includes the "grid-connected mode/islanded mode" and the "current source mode/voltage source mode". However, the dual-mode control based on the "grid-connected mode/islanded mode" cannot address the stability problem of the multi-inverter system based on the double split transformer in the weak grid. The dual-mode control based on the "current source mode/voltage source mode" is not completely described in prior literature, though improving the stability of the single-inverter system in the weak grid; and even though the solution can effectively improve the stability of the multi-inverter system in the weak grid by extending from the single-inverter system to the multi-inverter system based on the double split transformer, and switching the multi-inverter system from operating in the full current source mode to the hybrid mode (i.e., in a multi-inverter system, part of the GCIs operate in current source mode and the rest of the GCIs operate in voltage source mode), whether the hybrid mode keeps the system stable when the power grid becomes extremely weak (namely the extremely-weak grid) are not described in the prior literature.

(2) The solution, in which the equivalent grid impedance at a PCC of a GCI in the multi-inverter system based on the double split transformer is obtained with a grid impedance identification algorithm, and when the equivalent grid impedance gradually increases, i.e., when the power grid operates in the strong grid, weak grid, and extremely-weak grid respectively, the system sequentially operates in the full current source mode, the hybrid mode, and the full voltage source mode to effectively improve the stability of the multi-inverter system based on the double split transformer in a variation of the strong and weak grids, is not described in the prior literature.

SUMMARY

To overcome the limitations of the above various technical solutions, the present invention provides a dual-mode combined control method for a multi-inverter system based on a double split transformer, to solve the stability problem when the multi-inverter system based on the double split transformer in the extremely-weak grid operates in the conventional single current source mode or hybrid mode. According to the method, the equivalent grid impedance at a PCC of one GCI in the multi-inverter system based on the double split transformer is obtained with a grid impedance identification algorithm, and when the equivalent grid impedance gradually increases, namely the power grid respectively operates in the strong grid, weak grid, and extremely-weak grid, the system sequentially operates in a full current source mode, a hybrid mode, and a full voltage source mode, thereby effectively improving the stability of the multi-inverter system based on the double split transformer during variation of the strength of the grid. The present invention is implemented simply, and greatly increases the stability margin of the multi-inverter system based on the double split transformer during the drastic fluctuation of the grid impedance; and particularly, the present invention ensures that the system can still operate stably in the extremely-weak grid, and makes the system more adaptable to the power grid.

The objective of the present invention is achieved as follows: The present invention provides a dual-mode combined control method for a multi-inverter system based on a double split transformer, where the multi-inverter system based on the double split transformer in the control method includes two identical GCIs, and the dual-mode combined control method includes a full current source mode, a hybrid mode, and a full voltage source mode;

the control method includes the following steps:

step 1: selecting any GCI from the multi-inverter system, labeling the GCI as a 1 #GCI and the other GCI as a 2 #GCI, acquiring an equivalent grid impedance at a PCC of the 1 #GCI with a grid impedance identification algorithm, and labeling the equivalent grid impedance as a reference equivalent grid impedance $Z_{g\_est}$;

step 2: setting a lower boundary value $\lambda_1$ of equivalent grid impedance and an upper boundary value $\lambda_2$ of equivalent grid impedance, and performing the following determinations and operations according to the reference equivalent grid impedance $Z_{g\_est}$ in step 1:

determining, in response to $Z_{g\_est} \leq \lambda_1$, that a power grid is in a strong grid state, setting the multi-inverter system to operate in the full current source mode, and ending a control process;

determining, in response to $\lambda_1 < Z_{g\_est} \leq \lambda_2$, that the power grid is in a weak grid state, setting the multi-inverter system to operate in the hybrid mode, and ending a control process; and determining, in response to $Z_{g\_est} \leq \lambda_2$, that the power grid is in an extremely-weak grid state, setting the multi-inverter system to operate in the full voltage source mode, and ending a control process; and the full current source mode means that the two GCIs operate in a current source mode; the hybrid mode means that one GCI operates in the current source mode, and the other GCI operates in a voltage source mode; the full voltage source mode means that the two GCIs operate in the voltage source mode; and the GCIs each are a three-phase full-bridge GCI.

Preferably, the current source mode may include the following control steps:

step 2.1: sampling output grid-connected currents $i_{ga}$, $i_{gb}$, $i_{gc}$, and sampling PCC voltages $u_{pcca}$, $u_{pccb}$, $u_{pccc}$;

step 2.2: obtaining, according to the sampled PCC voltages $u_{pcca}$, $u_{pccb}$, $u_{pccc}$ in step 2.1, dq-axis components $u_{pccd}$, $u_{pccq}$ for the PCC voltages through a transformation equation from a three-phase static coordinate system to a two-phase rotating coordinate system; and obtaining a phase angle θ of each of the PCC voltages $u_{pcca}$, $u_{pccb}$, $u_{pccc}$ through a phase-locked loop (PLL).

a transformation equation for transforming the PCC voltages from the three-phase static coordinate system to the two-phase rotating coordinate system being:

$$u_{pccd} = \frac{2}{3}\left[u_{pcca}\cos\theta + u_{pccb}\cos\left(\theta - \frac{2\pi}{3}\right) + u_{pccc}\cos\left(\theta + \frac{2\pi}{3}\right)\right]$$

$$u_{pccq} = -\frac{2}{3}\left[u_{pcca}\sin\theta + u_{pccb}\sin\left(\theta - \frac{2\pi}{3}\right) + u_{pccc}\sin\left(\theta + \frac{2\pi}{3}\right)\right]$$

and an equation for calculating the phase angle θ of each of the PCC voltages being:

$$\theta = \frac{\omega_0 - (K_{p\_PLL} + K_{i\_PLL}/s) \cdot u_{pccq}}{s}$$

where, $\omega_0$ is a rated angular frequency of each of the PCC voltages, $K_{p\_PLL}$ is a proportional coefficient of a proportional-integral (PI) controller in the PLL, $K_{i\_PLL}$ is an integral coefficient of the PI controller in the PLL, and s is a Laplace operator;

step 2.3: transforming, according to the phase angle θ of each of the PCC voltages in step 2.2, the sampled output grid-connected currents $i_{ga}$, $i_{gb}$, $i_{gc}$ in step 2.1 into dq-axis components $i_{gd}$, $i_{gq}$ for the output grid-connected currents in the two-phase rotating coordinate system through the transformation equation from the three-phase static coordinate system to the two-phase rotating coordinate system, a transformation equation for transforming the output grid-connected currents from the three-phase static coordinate system to the two-phase rotating coordinate system being:

$$i_{gd} = \frac{2}{3}\left[i_{ga}\cos\theta + i_{gb}\cos\left(\theta - \frac{2\pi}{3}\right) + i_{gc}\cos\left(\theta + \frac{2\pi}{3}\right)\right]$$

-continued $$i_{gq} = -\frac{2}{3}\left[i_{ga}\sin\theta + i_{gb}\sin\left(\theta - \frac{2\pi}{3}\right) + i_{gc}\sin\left(\theta + \frac{2\pi}{3}\right)\right]$$

step 2.4: setting reference signals $i_{gdref}$, $i_{gqref}$ for the output grid-connected currents, and obtaining control signals $u_d$, $u_q$ through a grid current closed-loop control equation according to the dq-axis components $i_{gd}$, $i_{gq}$ for the output grid-connected currents in step 2.3, the grid current closed-loop control equation being:

$$u_d = \left(K_p + \frac{K_i}{s}\right) \cdot (i_{gdref} - i_{gd})$$

$$u_q = \left(K_p + \frac{K_i}{s}\right) \cdot (i_{gqref} - i_{gq})$$

where, $K_p$ is a proportional coefficient of a PI controller in the grid current closed-loop control equation, and $K_i$ is an integral coefficient of the PI controller in the grid current closed-loop control equation;

step 2.5: transforming, according to the phase angle θ of each of the PCC voltages in step 2.2, the control signals $u_d$, $u_q$ in step 2.4 into components $u_a$, $u_b$, $u_c$ for the control signals in the three-phase static coordinate system through a transformation equation from the two-phase rotating coordinate system to the three-phase static coordinate system, a transformation equation for transforming the control signals from the two-phase rotating coordinate system to the three-phase static coordinate system being:

$$u_a = u_d\cos\theta - u_q\sin\theta$$

$$u_b = u_d\cos\left(\theta - \frac{2\pi}{3}\right) - u_q\sin\left(\theta - \frac{2\pi}{3}\right)$$

$$u_c = u_d\cos\left(\theta + \frac{2\pi}{3}\right) - u_q\sin\left(\theta + \frac{2\pi}{3}\right)$$

and step 2.6: adding the components $u_a$, $u_b$, $u_c$ in the three-phase static coordinate system in step 2.5 and the PCC voltages $u_{pcca}$, $u_{pccb}$, $u_{pccc}$ in step 2.1, respectively, to obtain bridge arm voltage control signals $u_a+u_{pcca}$, $u_b+u_{pccb}$, $u_c+u_{pccc}$ of the three-phase full-bridge GCI, performing space vector pulse width modulation (SVPWM) to generate a switching signal for a power device of the GCI, and controlling connection and disconnection of the power device of the three-phase full-bridge GCI through a driving circuit.

Preferably, the voltage source mode may include the following control steps:

step 3.1: sampling output grid-connected currents $i_{ga}$, $i_{gb}$, $i_{gc}$, and sampling PCC voltages $u_{pcca}$, $u_{pccb}$, $u_{pccc}$;

step 3.2: obtaining, according to the sampled output grid-connected currents $i_{ga}$, $i_{gb}$, $i_{gc}$ in step 3.1, αβ-axis components $i_{g\alpha}$, $i_{g\beta}$ for the output grid-connected currents through a transformation equation from a three-phase static coordinate system to a two-phase static coordinate system; and obtaining, according to the sampled PCC voltages $u_{pcca}$, $u_{pccb}$, $u_{pccc}$ in step 3.1, αβ-axis components $u_{pcc\alpha}$, $u_{pcc\beta}$ for the PCC voltages through the transformation equation from the three-phase static coordinate system to the two-phase static coordinate system, a transformation equation for transforming the output grid-connected currents from the three-phase static coordinate system to the two-phase static coordinate system being:

$$i_{g\alpha} = \frac{2}{3}\left(i_{ga} - \frac{1}{2}i_{gb} - \frac{1}{2}i_{gc}\right)$$

$$i_{g\beta} = \frac{2}{3}\left(\frac{\sqrt{3}}{2}i_{gb} - \frac{\sqrt{3}}{2}i_{gc}\right)$$

and a transformation equation for transforming the PCC voltages from the three-phase static coordinate system to the two-phase static coordinate system being:

$$u_{pcc\alpha} = \frac{2}{3}\left(u_{pcca} - \frac{1}{2}u_{pccb} - \frac{1}{2}u_{pccc}\right)$$

$$u_{pcc\beta} = \frac{2}{3}\left(\frac{\sqrt{3}}{2}u_{pccb} - \frac{\sqrt{3}}{2}u_{pccc}\right)$$

step 3.3: according to the αβ-axis components $i_{g\alpha}$, $i_{g\beta}$ for the output grid-connected currents and the αβ-axis components $u_{pcc\alpha}$, $u_{pcc\beta}$ for the PCC voltages in step 3.2, obtaining an average active power $\overline{P}$ through an equation for calculating the average active power, and obtaining an average reactive power $\overline{Q}$ through an equation for calculating the average reactive power, the equation for calculating the average active power being:

$$\overline{P} = \frac{1.5}{\tau s + 1}(u_{pcc\alpha}i_{g\alpha} + u_{pcc\beta}i_{g\beta})$$

and the equation for calculating the average reactive power being:

$$\overline{Q} = \frac{1.5}{\tau s + 1}(u_{pcc\alpha}i_{g\beta} - u_{pcc\beta}i_{g\alpha})$$

where, τ is a time constant of a first-order low-pass filter, and s is a Laplace operator;

step 3.4: obtaining, according to the average active power $\overline{P}$ in step 3.3, an output angular frequency ω of the GCI through an active power-frequency droop control equation, the active power-frequency droop control equation being:

ω=ω$_n$+D$_p$(P$_n$−$\overline{P}$)

where, $P_n$ is a given active power reference of the GCI, $\omega_n$ is a rated angular frequency of the GCI corresponding to the given active power reference $P_n$, and $D_p$ is a droop coefficient of an active power loop; and integrating the output angular frequency ω of the GCI to obtain an output phase angle $\theta_0$ of the GCI, namely:

$$\theta_0 = \frac{\omega}{s}$$

step 3.5: obtaining, according to the sampled PCC voltages $u_{pcca}$, $u_{pccb}$, $u_{pccc}$ in step 3.1, and the output phase angle $\theta_0$ of the GCI in step 3.4, dq-axis components $u_{pccd}$, $u_{pccq}$ for the PCC voltages through a transformation equation from the three-phase static coordinate system to a two-phase rotating coordinate system, a transformation equation for transforming the PCC voltages from the three-phase static coordinate system to the two-phase rotating coordinate system being:

$$u_{pccd} = \frac{2}{3}\left[u_{pcca}\cos\theta_0 + u_{pccb}\cos\left(\theta_0 - \frac{2\pi}{3}\right) + u_{pccc}\cos\left(\theta_0 + \frac{2\pi}{3}\right)\right]$$

$$u_{pccq} = -\frac{2}{3}\left[u_{pcca}\sin\theta_0 + u_{pccb}\sin\left(\theta_0 - \frac{2\pi}{3}\right) + u_{pccc}\sin\left(\theta_0 + \frac{2\pi}{3}\right)\right]$$

step 3.6: obtaining, according to the sampled output grid-connected currents $i_{ga}$, $i_{gb}$, $i_{gc}$ in step 3.1, and the output phase angle $\theta_0$ of the GCI in step 3.4, dq-axis components $i_{gd}$, $i_{gq}$ for the output grid-connected currents through the transformation equation from the three-phase static coordinate system to the two-phase rotating coordinate system, a transformation equation for transforming the output grid-connected currents from the three-phase static coordinate system to the two-phase rotating coordinate system being:

$$i_{gd} = \frac{2}{3}\left[i_{ga}\cos\theta_0 + i_{gb}\cos\left(\theta_0 - \frac{2\pi}{3}\right) + i_{gc}\cos\left(\theta_0 + \frac{2\pi}{3}\right)\right]$$

$$i_{gq} = -\frac{2}{3}\left[i_{ga}\sin\theta_0 + i_{gb}\sin\left(\theta_0 - \frac{2\pi}{3}\right) + i_{gc}\sin\left(\theta_0 + \frac{2\pi}{3}\right)\right]$$

step 3.7: obtaining, according to the output average reactive power $\overline{Q}$ of the GCI in step 3.3, reference values $u_{pccdref}$, $u_{pccqref}$ of the dq-axis components for the PCC voltages of the GCI through a reactive power-amplitude droop control equation, the reactive power-amplitude droop control equation being:

$$u_{pccdref} = U_n + D_q(Q_n - \overline{Q})$$

$$u_{pccqref} = 0$$

where, $U_n$ is a rated output voltage of the GCI corresponding to a given reactive power reference $Q_n$, and $D_q$ is a droop coefficient of a reactive power loop;

step 3.8: obtaining reference signals $i_{gdref}$, $i_{gqref}$ for the output grid-connected currents through a voltage loop control equation according to the dq-axis components $u_{pccd}$, $u_{pccq}$ for the PCC voltages in step 3.5 and the reference values $u_{pccdref}$, $u_{pccqref}$ of the dq-axis components for the PCC voltages in step 3.7, the voltage loop control equation being:

$$i_{gdref} = \left(K_{p1} + \frac{K_{i1}}{s}\right) \cdot (u_{pccdref} - u_{pccd})$$

$$i_{gqref} = \left(K_{p1} + \frac{K_{i1}}{s}\right) \cdot (u_{pccqref} - u_{pccq})$$

where, $K_{p1}$ is a proportional coefficient of a PI controller in the voltage loop control equation, and $K_{i1}$ is an integral coefficient of the PI controller in the voltage loop control equation;

step 3.9: obtaining control signals $u_d$, $u_q$ through a current loop control equation according to the reference signals $i_{gdref}$, $i_{gqref}$ for the output grid-connected currents in step 3.8 and the dq-axis components $i_{gd}$, $i_{gq}$ for the output grid-connected currents in step 3.6, the current loop control equation being:

$$u_d = \left(K_{p2} + \frac{K_{i2}}{s}\right) \cdot (i_{gdref} - i_{gd})$$

$$u_q = \left(K_{p2} + \frac{K_{i2}}{s}\right) \cdot (i_{gqref} - i_{gq})$$

where, $K_{p2}$ is a proportional coefficient of a PI controller in the current loop control equation, and $K_{i2}$ is an integral coefficient of the PI controller in the current loop control equation;

step 3.10: transforming, according to the output phase angle $\theta_0$ of the GCI in step 3.4, the control signals $u_d$, $u_q$ in step 3.9 into components $u_a$, $u_b$, $u_c$ for the control signals in the three-phase static coordinate system through a transformation equation from the two-phase rotating coordinate system to the three-phase static coordinate system, a transformation equation for transforming the control signals from the two-phase rotating coordinate system to the three-phase static coordinate system being:

$$u_a = u_d\cos\theta_0 - u_q\sin\theta_0$$

$$u_b = u_d\cos\left(\theta_0 - \frac{2\pi}{3}\right) - u_q\sin\left(\theta_0 - \frac{2\pi}{3}\right)$$

$$u_c = u_d\cos\left(\theta_0 + \frac{2\pi}{3}\right) - u_q\sin\left(\theta_0 + \frac{2\pi}{3}\right)$$

and step 3.11: adding the components $u_a$, $u_b$, $u_c$ in the three-phase static coordinate system in step 3.10 and the PCC voltages $u_{pcca}$, $u_{pccb}$, $u_{pccc}$ in step 3.1 to obtain bridge arm voltage control signals $u_a + u_{pcca}$, $u_b + u_{pccb}$, $u_c + u_{pccc}$ of the three-phase full-bridge GCI, generating switching signals for a power device of the GCI through the SVPWM, and controlling the opening and closing of the power device of the three-phase full-bridge GCI through a driving circuit.

Compared with the prior art, the present invention has the following beneficial effects:

1. The present invention is implemented simply; and by employing the dual-mode combined control based on the "current source mode/voltage source mode", i.e., three types of combined control are introduced: the full current source mode, the hybrid mode, and the full voltage source mode. The present invention greatly increases the stability margin of the multi-inverter system based on the double split transformer during drastic fluctuation of the grid impedance.
2. With the full voltage source mode, the present invention ensures that the multi-inverter system based on the double split transformer in the extremely-weak grid can still operate stably, and makes the system more adaptable to the power grid.
3. The present invention can improve the grid connection stability of the whole multi-inverter system, suppresses the resonance, and solves other stability problems caused by the multi-inverter system based on the double split transformer in the weak grid or extremely-weak grid operating in the single current source mode.

4. According to the present invention, the equivalent grid impedance at a PCC of a GCI in the multi-inverter system based on the double split transformer is obtained with the grid impedance identification algorithm, and when the equivalent grid impedance gradually increases, namely when the power grid respectively operates in the strong grid, weak grid and extremely-weak grid, the system sequentially operates in the full current source mode, hybrid mode, and full voltage source mode, thereby effectively improving the stability of the multi-inverter system based on the double split transformer in the variation of the strength of the grid; and therefore, the implementation method is simple and effective.

DETAILED DESCRIPTION OF THE EMBODIMENTS

The embodiment of the present invention provides a dual-mode combined control method for a multi-inverter system based on a double split transformer, to solve the stability problem when the multi-inverter system based on the double split transformer in the extremely-weak grid operates in the conventional single current source mode or hybrid mode. According to this method, the equivalent grid impedance at a PCC of one GCI in the multi-inverter system based on the double split transformer is obtained with a grid impedance identification algorithm, and when the equivalent grid impedance gradually increases, namely the power grid respectively operates in the strong grid, weak grid and extremely-weak grid, the system sequentially operates in a full current source mode, a hybrid mode, and a full voltage source mode, thereby effectively improving the stability of the multi-inverter system based on the double split transformer during variation of the strength of the grid. The present invention is implemented simply, and greatly increases the stability margin of the multi-inverter system based on the double split transformer during the drastic fluctuation of the grid impedance; and particularly, the present invention ensures that the system can still operate stably in the extremely-weak grid, and makes the system more adaptable to the power grid.

The technical solutions in the present invention will be clearly and completely described below with reference to the accompanying drawings.

Figure 1:
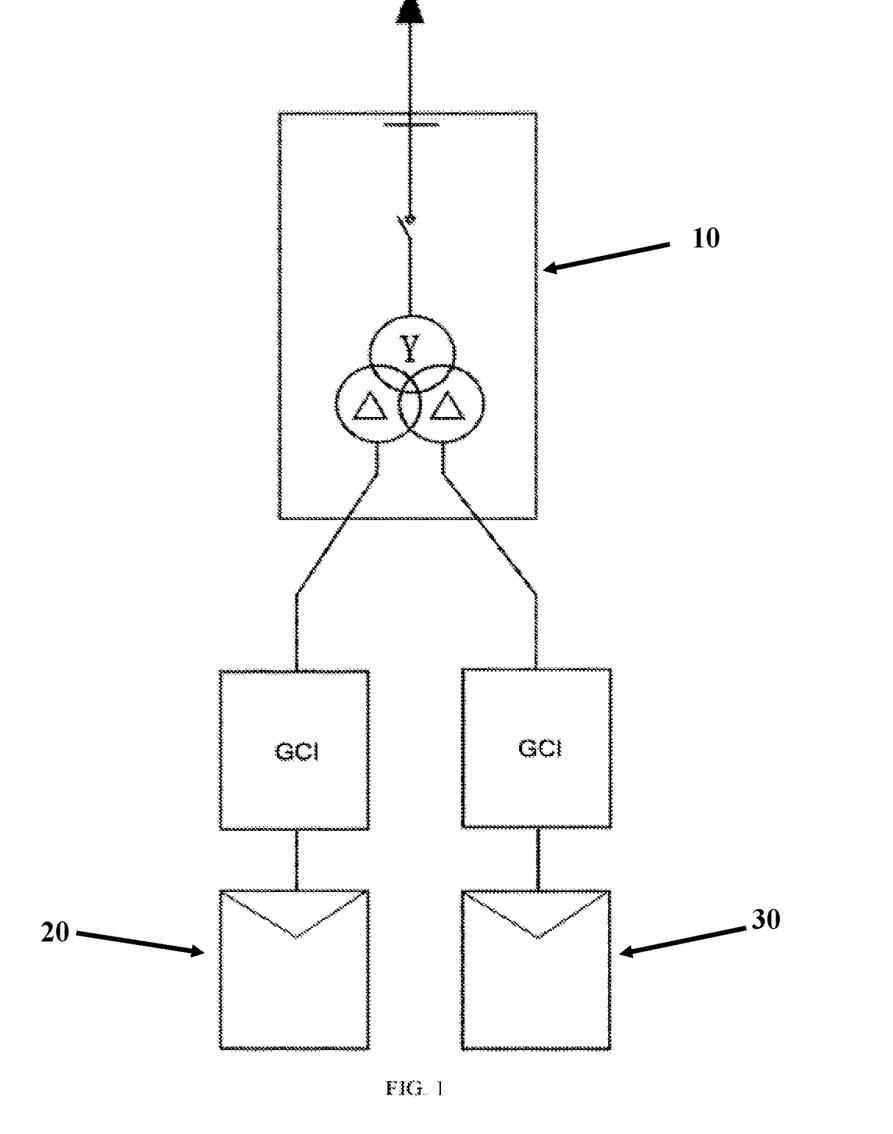
FIG. 1 is a schematic structural view of a multi-inverter system based on a double split transformer according to the present invention.

FIG. 1 illustrates a schematic structural view of a multi-inverter system based on a double split transformer 10 according to the present invention. The multi-inverter system includes two identical GCIs; the GCIs each are connected to a photovoltaic cell panel (e.g., photovoltaic cell panel 20 and photovoltaic cell panel 30); and one double split transformer is connected to the multi-inverter system composed of two GCIs.

Figure 2:
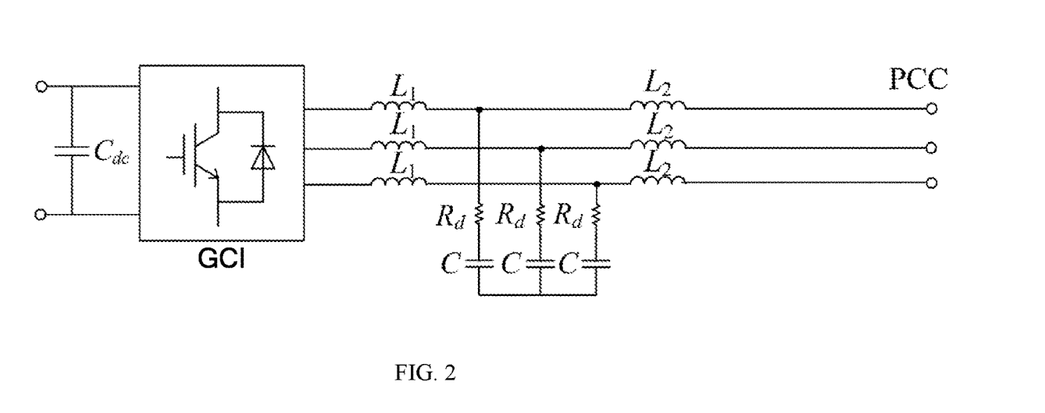
FIG. 2 is a topological structure of a single GCI in a multi-inverter system based on a double split transformer according to the present invention.

FIG. 2 illustrates a topological structure of a single GCI in a multi-inverter system based on a double split transformer according to the present invention. As can be seen from FIG. 2, the single GCI is a three-phase full-bridge GCI, and the topological structure includes a direct-current (DC)-side filter capacitor $C_{dc}$, a topology of a three-phase bridge inverter, an inverter-side inductor $L_1$, a filter capacitor C, a damping resistor $R_d$, a grid-side inductor $L_2$ and a PCC. In the embodiment, $C_{dc}$=600 μF, $L_1$=0.9 mH, C=20 μF, $R_d$=0.6 Ω, and $L_2$=0.05 mH.

Figure 3:
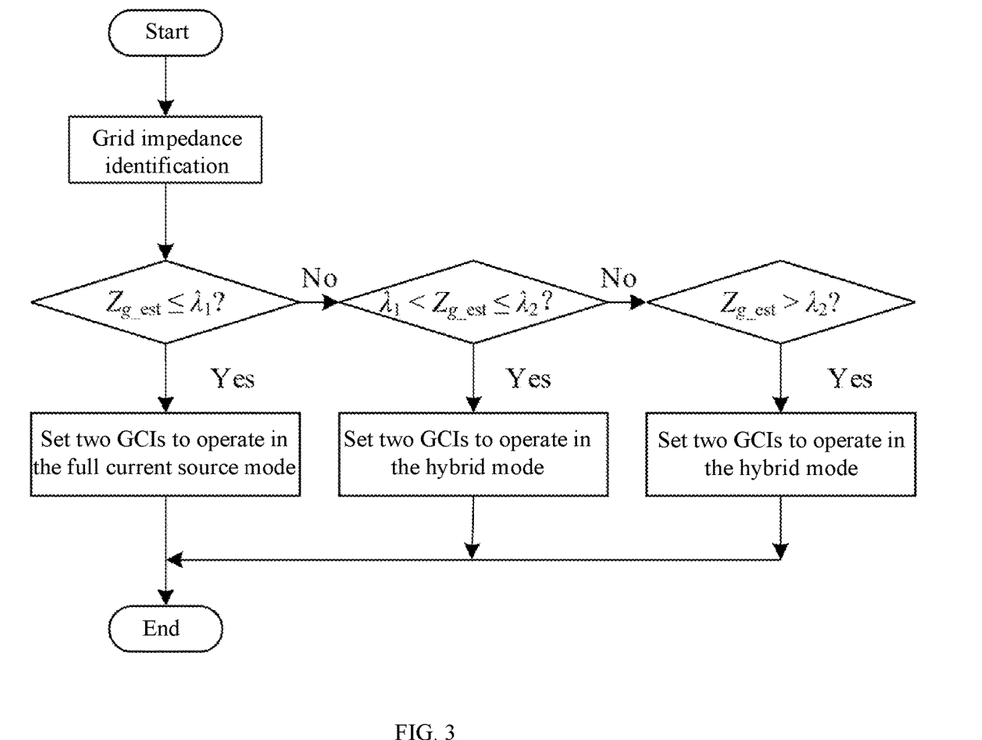
FIG. 3 is a flow chart for implementation according to the present invention.

FIG. 3 is a flow chart for implementation according to the present invention; As shown in FIG. 3, the dual-mode combined control method includes a full current source mode, a hybrid mode, and a full voltage source mode.

Specifically, the control method includes the following steps:

Step 1: Select any GCI from the multi-inverter system, label the GCI as a 1 #GCI and the other GCI as a 2 #GCI, acquire an equivalent grid impedance at a PCC of the 1 #GCI with a grid impedance identification algorithm, and label the equivalent grid impedance as a reference equivalent grid impedance $Z_{g\_est}$.

Step 2: Set a lower boundary value $\lambda_1$ of equivalent grid impedance and an upper boundary value $\lambda_2$ of equivalent grid impedance, and perform the following determinations and operations according to the reference equivalent grid impedance $Z_{g\_est}$ in Step 1:

Determine, in response to $Z_{g\_est} \leq \lambda_1$, that a power grid is in a strong grid state, set the multi-inverter system to operate in the full current source mode, and end a control process.

Determine, in response to $\lambda_1 < Z_{g\_est} < \lambda_2$, that the power grid is in a weak grid state, set the multi-inverter system to operate in the hybrid mode, and end a control process.

Determine, in response to $Z_{g\_est} > \lambda_2$, that the power grid is in an extremely-weak grid state, set the multi-inverter system to operate in the full voltage source mode, and end a control process.

The full current source mode means that the two GCIs operate in a current source mode; the hybrid mode means that one GCI operates in the current source mode, and the other GCI operates in a voltage source mode; and the full voltage source mode means that the two GCIs operate in the voltage source mode.

In the embodiment of the present invention, $\lambda_1$=0.98 mH, and $\lambda_2$=2 mH.

Figure 4:
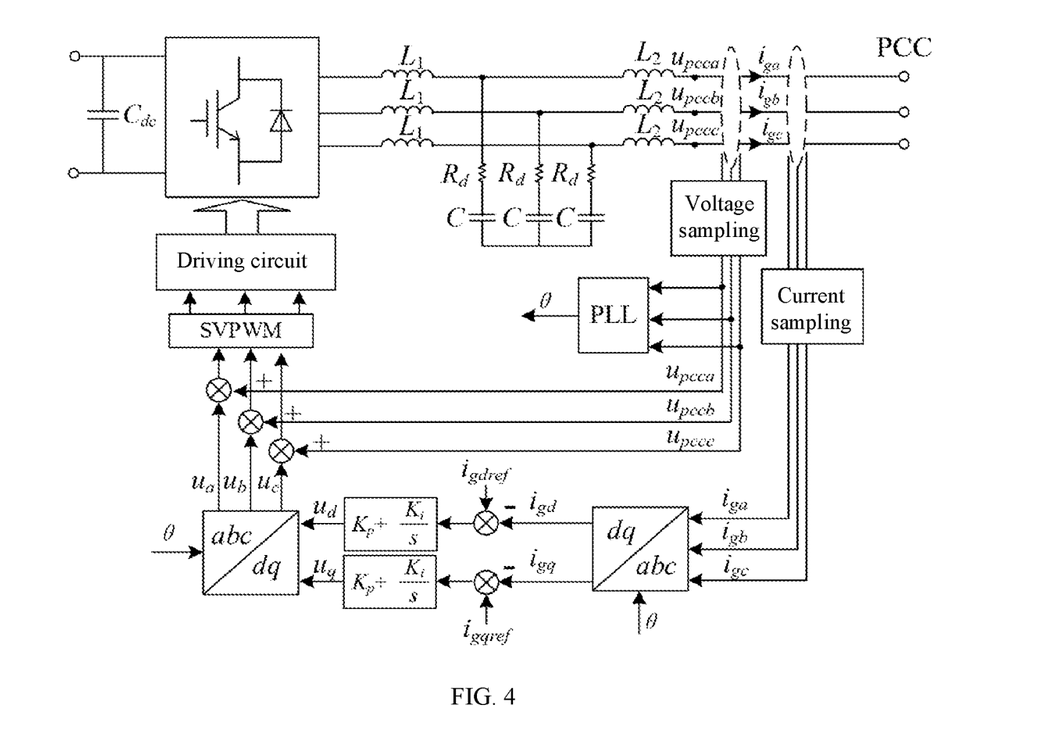
FIG. 4 is a schematic view of a control strategy when a single GCI in a multi-inverter system based on a double split transformer in a weak grid operates in a current source mode.

FIG. 4 is a schematic view of a control strategy when a single GCI in a multi-inverter system based on a double split transformer in a weak grid operates in a current source mode. As shown in FIG. 4, the GCI operating in the current source mode is controlled with the following steps:

Step 2.1: Sample output grid-connected currents $i_{ga}$, $i_{gb}$, $i_{gc}$, and sample PCC voltages $u_{pcca}$, $u_{pccb}$, $u_{pccc}$. In the embodiment of the present invention, the current sensor has a sample proportion of 29, and the voltage sensor has a sample proportion of 400.

Step 2.2: Obtain, according to the sampled PCC voltages $u_{pcca}$, $u_{pccb}$, $u_{pccc}$ in step 2.1, dq-axis components $u_{pccd}$, $u_{pccq}$ for the PCC voltages through a transformation equation from a three-phase static coordinate system to a two-phase rotating coordinate system, and obtain a phase angle θ of each of the PCC voltages $u_{pcca}$, $u_{pccb}$, $u_{pccc}$ through a PLL.

A transformation equation for transforming the PCC voltages from the three-phase static coordinate system to the two-phase rotating coordinate system is:

$$u_{pccd} = \frac{2}{3}\left[u_{pcca}\cos\theta + u_{pccb}\cos\left(\theta - \frac{2\pi}{3}\right) + u_{pccc}\cos\left(\theta + \frac{2\pi}{3}\right)\right]$$

$$u_{pccq} = -\frac{2}{3}\left[u_{pcca}\sin\theta + u_{pccb}\sin\left(\theta - \frac{2\pi}{3}\right) + u_{pccc}\sin\left(\theta + \frac{2\pi}{3}\right)\right]$$

An equation for calculating the phase angle θ of each of the PCC voltages is:

$$\theta = \frac{\omega_0 - (K_{p\_PLL} + K_{i\_PLL}/s) \cdot u_{pccq}}{s}$$

where, $\omega_0$ is a rated angular frequency of each of the PCC voltages, $K_{p\_PLL}$ is a proportional coefficient of a PI controller in the PLL, $K_{i\_PLL}$ is an integral coefficient of the PI controller in the PLL, and s is a Laplace operator. In the embodiment of the present invention, $\omega_0$=314 rad/s, $K_{p\_PLL}$=0.3, and $K_{i\_PLL}$=36.

Step 2.3: Transform, according to the phase angle θ of each of the PCC voltages in Step 2.2, the sampled output grid-connected currents $i_{ga}$, $i_{gb}$, $i_{gc}$ in Step 2.1 into dq-axis components $i_{gd}$, $i_{gq}$ for the output grid-connected currents in the two-phase rotating coordinate system through the transformation equation from the three-phase static coordinate system to the two-phase rotating coordinate system.

A transformation equation for transforming the output grid-connected currents from the three-phase static coordinate system to the two-phase rotating coordinate system is:

$$i_{gd} = \frac{2}{3}\left[i_{ga}\cos\theta + i_{gb}\cos\left(\theta - \frac{2\pi}{3}\right) + i_{gc}\cos\left(\theta + \frac{2\pi}{3}\right)\right]$$

$$i_{gq} = -\frac{2}{3}\left[i_{ga}\sin\theta + i_{gb}\sin\left(\theta - \frac{2\pi}{3}\right) + i_{gc}\sin\left(\theta + \frac{2\pi}{3}\right)\right]$$

Step 2.4: Set reference signals $i_{gdref}$, $i_{gqref}$ for the output grid-connected currents, and obtain control signals $u_d$, $u_q$ through a grid current closed-loop control equation according to the dq-axis components $i_{gd}$, $i_{gq}$ for the output grid-connected currents in step 2.3.

The grid current closed-loop control equation is:

$$u_d = \left(K_p + \frac{K_i}{s}\right) \cdot (i_{gdref} - i_{gd})$$

$$u_q = \left(K_p + \frac{K_i}{s}\right) \cdot (i_{gqref} - i_{gq})$$

where, $K_p$ is a proportional coefficient of a PI controller in the grid current closed-loop control equation, and $K_i$ is an integral coefficient of the PI controller in the grid current closed-loop control equation. In the embodiment of the present invention, $K_p$=67.2, and $K_i$=180, 000.

Step 2.5: Transform, according to the phase angle θ of each of the PCC voltages in Step 2.2, the control signals $u_d$, $u_q$ in Step 2.4 into components $u_a$, $u_b$, $u_c$ for the control signals in the three-phase static coordinate system through a transformation equation from the two-phase rotating coordinate system to the three-phase static coordinate system.

A transformation equation for transforming the control signals from the two-phase rotating coordinate system to the three-phase static coordinate system is:

$$u_a = u_d\cos\theta - u_q\sin\theta$$

$$u_b = u_d\cos\left(\theta - \frac{2\pi}{3}\right) - u_q\sin\left(\theta - \frac{2\pi}{3}\right)$$

$$u_c = u_d\cos\left(\theta + \frac{2\pi}{3}\right) - u_q\sin\left(\theta + \frac{2\pi}{3}\right)$$

Step 2.6: Add the components $u_a$, $u_b$, $u_c$ in the three-phase static coordinate system in Step 2.5 and the PCC voltages $u_{pcca}$, $u_{pccb}$, $u_{pccc}$ in Step 2.1, respectively, to obtain bridge arm voltage control signals $u_a+u_{pcca}$, $u_b+u_{pccb}$, $u_c+u_{pccc}$ of the three-phase full-bridge GCI, perform (SVPWM) to generate a switching signal for a power device of the GCI, and control connection and disconnection of the power device of the three-phase full-bridge GCI through a driving circuit.

Figure 5:
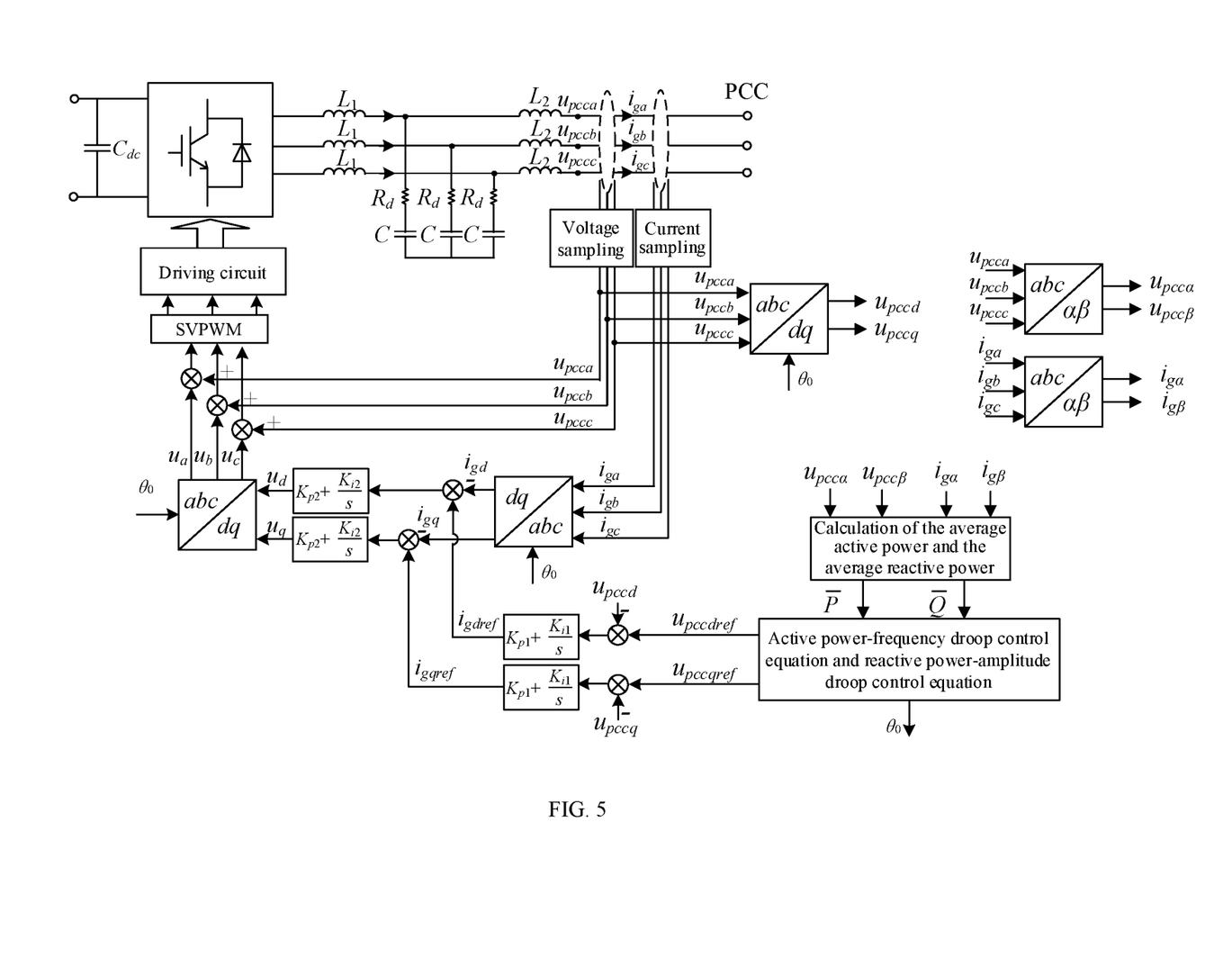
FIG. 5 is a schematic view of a control strategy when a single GCI in a multi-inverter system based on a double split transformer in a weak grid operates in a voltage source mode.

FIG. 5 is a schematic view of a control strategy when a single GCI in a multi-inverter system in a weak grid operates in a voltage source mode. As shown in FIG. 5, the GCI operating in the voltage source mode is controlled with the following steps:

Step 3.1: Sample output grid-connected currents $i_{ga}$, $i_{gb}$, $i_{gc}$ and sample PCC voltages $u_{pcca}$, $u_{pccb}$, $u_{pccc}$.

Step 3.2: Obtain, according to the sampled output grid-connected currents $i_{ga}$, $i_{gb}$, $i_{gc}$ in Step 3.1, αβ-axis components $i_{g\alpha}$, $i_{g\beta}$ for the output grid-connected currents through a transformation equation from a three-phase static coordinate system to a two-phase static coordinate system; and obtain, according to the sampled PCC voltages $u_{pcca}$, $u_{pccb}$, $u_{pccc}$ in Step 3.1, αβ-axis components $u_{pcc\alpha}$, $u_{pcc\beta}$ for the PCC voltages through the transformation equation from the three-phase static coordinate system to the two-phase static coordinate system.

A transformation equation for transforming the output grid-connected currents from the three-phase static coordinate system to the two-phase static coordinate system is:

$$i_{g\alpha} = \frac{2}{3}\left(i_{ga} - \frac{1}{2}i_{gb} - \frac{1}{2}i_{gc}\right)$$

$$i_{g\beta} = \frac{2}{3}\left(\frac{\sqrt{3}}{2}i_{gb} - \frac{\sqrt{3}}{2}i_{gc}\right)$$

A transformation equation for transforming the PCC voltages from the three-phase static coordinate system to the two-phase static coordinate system is:

$$u_{pcc\alpha} = \frac{2}{3}\left(u_{pcca} - \frac{1}{2}u_{pccb} - \frac{1}{2}u_{pcc}\right)$$

$$u_{pcc\beta} = \frac{2}{3}\left(\frac{\sqrt{3}}{2}u_{pccb} - \frac{\sqrt{3}}{2}u_{pccc}\right)$$

Step 3.3: According to the αβ-axis components $i_{g\alpha}$, $i_{g\beta}$ for the output grid-connected currents, and the αβ-axis components $u_{pcc\alpha}$, $u_{pcc\beta}$ for the PCC voltages in Step 3.2, obtain an average active power $\overline{P}$ through an equation for calculating the average active power, and obtain an average reactive power $\overline{Q}$ through an equation for calculating the average reactive power.

The equation for calculating the average active power is:

$$\overline{P} = \frac{1.5}{\tau s + 1}(u_{pcc\alpha}i_{g\alpha} + u_{pcc\beta}i_{g\beta})$$

The equation for calculating the average reactive power is:

$$\overline{Q} = \frac{1.5}{\tau s + 1}(u_{pcc\alpha}i_{g\beta} - u_{pcc\beta}i_{g\alpha})$$

where, τ is the time constant of a first-order low-pass filter, and s is a Laplace operator. In the embodiment of the present invention, τ=0.00667 s.

Step 3.4: Obtain, according to the average active power $\overline{P}$ in Step 3.3, an output angular frequency ω of the GCI through an active power-frequency droop control equation, the active power-frequency droop control equation being:

ω=ω$_n$+D$_p$(P$_n$−$\overline{P}$)

where, P$_n$ is a given active power reference of the GCI, ω$_n$ is a rated angular frequency of the GCI corresponding to the given active power reference P$_n$, and D$_p$ is a droop coefficient of an active power loop. In the embodiment of the present invention, ω$_n$=314 rad/s, P$_n$=100 kW, and D$_p$=0.0001.

Integrate the output angular frequency ω of the GCI to obtain an output phase angle θ$_0$ of the GCI, namely:

$$\theta_0 = \frac{\omega}{s}$$

Step 3.5: Obtain, according to the sampled PCC voltages $u_{pcca}$, $u_{pccb}$, $u_{pccc}$ in Step 3.1, and the output phase angle θ$_0$ of the GCI in Step 3.4, dq-axis components $u_{pccd}$, $u_{pccq}$ for the PCC voltages through a transformation equation from the three-phase static coordinate system to a two-phase rotating coordinate system.

A transformation equation for transforming the PCC voltages from the three-phase static coordinate system to the two-phase rotating coordinate system is:

$$u_{pccd} = \frac{2}{3}\left[u_{pcca}\cos\theta_0 + u_{pccb}\cos\left(\theta_0 - \frac{2\pi}{3}\right) + u_{pccc}\cos\left(\theta_0 + \frac{2\pi}{3}\right)\right]$$

-continued $$u_{pccq} = -\frac{2}{3}\left[u_{pcca}\sin\theta_0 + u_{pccb}\sin\left(\theta_0 - \frac{2\pi}{3}\right) + u_{pccc}\sin\left(\theta_0 + \frac{2\pi}{3}\right)\right]$$

Step 3.6: Obtain, according to the sampled output grid-connected currents $i_{ga}$, $i_{gb}$, $i_{gc}$ in Step 3.1, and the output phase angle θ$_0$ of the GCI in Step 3.4, dq-axis components $i_{gd}$, $i_{gq}$ for the output grid-connected currents through the transformation equation from the three-phase static coordinate system to the two-phase rotating coordinate system.

A transformation equation for transforming the output grid-connected currents from the three-phase static coordinate system to the two-phase rotating coordinate system is:

$$i_{gd} = \frac{2}{3}\left[i_{ga}\cos\theta_0 + i_{gb}\cos\left(\theta_0 - \frac{2\pi}{3}\right) + i_{gc}\cos\left(\theta_0 + \frac{2\pi}{3}\right)\right]$$

$$i_{gq} = -\frac{2}{3}\left[i_{ga}\sin\theta_0 + i_{gb}\sin\left(\theta_0 - \frac{2\pi}{3}\right) + i_{gc}\sin\left(\theta_0 + \frac{2\pi}{3}\right)\right]$$

Step 3.7: Obtain, according to the output average reactive power $\overline{Q}$ of the GCI in Step 3.3, reference values $u_{pccdref}$, $u_{pccqref}$ of the dq-axis components for the PCC voltages of the GCI through a reactive power-amplitude droop control equation, the reactive power-amplitude droop control equation being:

$u_{pccdref}$=U$_n$+D$_q$(Q$_n$−$\overline{Q}$)

$u_{pccqref}$=0 where, U$_n$ is a rated output voltage of the GCI corresponding to a given reactive power reference Q$_n$, and D$_q$ is a droop coefficient of a reactive power loop. In the embodiment of the present invention, U$_n$=220 V, Q$_n$=0, and D$_q$=0.0001.

Step 3.8: Obtain reference signals $i_{gdref}$, $i_{gqref}$ for the output grid-connected currents through a voltage loop control equation according to the dq-axis components $u_{pccd}$, $u_{pccq}$ for the PCC voltages in Step 3.5 and the reference values $u_{pccdref}$, $u_{pccqref}$ of the dq-axis components for the PCC voltages in Step 3.7.

The voltage loop control equation is:

$$i_{gdref} = \left(K_{p1} + \frac{K_{i1}}{s}\right) \cdot (u_{pccdref} - u_{pccd})$$

$$i_{gqref} = \left(K_{p1} + \frac{K_{i1}}{s}\right) \cdot (u_{pccqref} - u_{pccq})$$

where, K$_{p1}$ is a proportional coefficient of a PI controller in the voltage loop control equation, and K$_{i1}$ is an integral coefficient of the PI controller in the voltage loop control equation. In the embodiment of the present invention, K$_{p1}$=0.05, and K$_{i1}$=3,223.

Step 3.9: Obtain control signals $u_d$, $u_q$ through a current loop control equation according to the reference signals $i_{gdref}$, $i_{gqref}$ for the output grid-connected currents in Step 3.8 and the dq-axis components $i_{gd}$, $i_{gq}$ for the output grid-connected currents in Step 3.6.

The current loop control equation is:

$$u_d = \left(K_{p2} + \frac{K_{i2}}{s}\right) \cdot (i_{gdref} - i_{gd})$$

-continued
$$u_q = \left(K_{p2} + \frac{K_{i2}}{s}\right) \cdot (i_{gqref} - i_{gq})$$

where, $K_{p2}$ is a proportional coefficient of a PI controller in the current loop control equation, and $K_{i2}$ is an integral coefficient of the PI controller in the current loop control equation. In the embodiment of the present invention, $K_{p2}=200$, and $K_{i2}=0$.

Step 3.10: Transform, according to the output phase angle $\theta_0$ of the GCI in Step 3.4, the control signals $u_d$, $u_q$ in Step 3.9 into components $u_a$, $u_b$, $u_c$ for the control signals in the three-phase static coordinate system through a transformation equation from the two-phase rotating coordinate system to the three-phase static coordinate system.

A transformation equation for transforming the control signals from the two-phase rotating coordinate system to the three-phase static coordinate system is:

$$u_a = u_d\cos\theta_0 - u_q\sin\theta_0$$
$$u_b = u_d\cos\left(\theta_0 - \frac{2\pi}{3}\right) - u_q\sin\left(\theta_0 - \frac{2\pi}{3}\right)$$
$$u_c = u_d\cos\left(\theta_0 + \frac{2\pi}{3}\right) - u_q\sin\left(\theta_0 + \frac{2\pi}{3}\right)$$

Step 3.11: Add the components $u_a$, $u_b$, $u_c$ in the three-phase static coordinate system in Step 3.10 and the PCC voltages $u_{pcca}$, $u_{pccb}$, $u_{pccc}$ in Step 3.1 to obtain bridge arm voltage control signals $u_a+u_{pcca}$, $u_b+u_{pccb}$, $u_c+u_{pccc}$ of the three-phase full-bridge GCI, generating switching signals for a power device of the GCI through the SVPWM, and control the opening and closing of the power device of the three-phase full-bridge GCI through a driving circuit.

Figure 6:
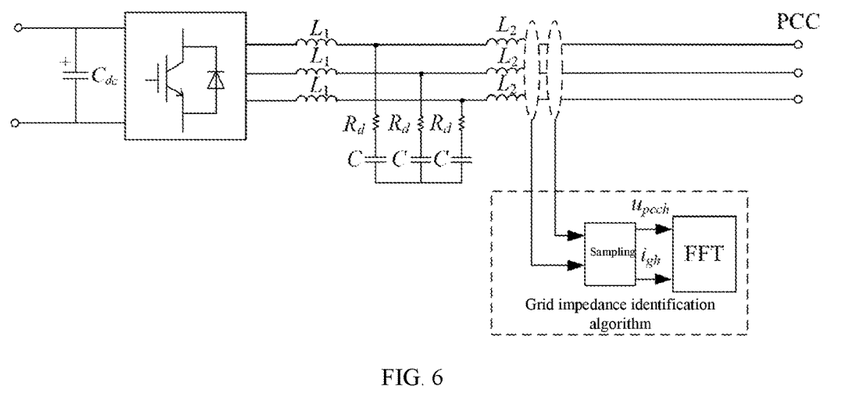
FIG. 6 is a block diagram of a grid impedance identification algorithm based on uncharacteristic harmonic injection according to the present invention.

FIG. 6 is a block diagram of a grid impedance identification algorithm based on uncharacteristic harmonic injection according to the present invention. As shown in FIG. 6, the grid impedance identification algorithm in Step 1 includes the following steps:

Step 1.1: Inject an uncharacteristic harmonic current having a 75 Hz frequency at the PCC. In the embodiment of the present invention, the amplitude of the injected uncharacteristic harmonic current having the 75 Hz frequency is 8 A.

Step 1.2: Sample a harmonic response voltage $u_{pcch}$ and a harmonic response current $i_{gh}$ at the PCC.

Step 1.3: Analyze a spectrum of each of the harmonic response voltage $u_{pcch}$ and a harmonic response current $i_{gh}$ through a fast Fourier transform (FFT) to obtain an amplitude $|U_{pcch\_75\ Hz}|$ of a harmonic response voltage component at the 75 Hz frequency, a phase $\angle U_{pcch\_75\ Hz}$ of the harmonic response voltage component at the 75 Hz frequency, an amplitude $|I_{pcch\_75\ Hz}|$ of a harmonic response current component at the 75 Hz frequency, and a phase $\angle I_{pcch\_75\ Hz}$ of the harmonic response current component at the 75 Hz frequency; and obtain an amplitude $|Z_g|$ of a grid impedance at the 75 Hz frequency and a phase $\angle Z_g$ of the grid impedance at the 75 Hz frequency according to the following equation:

$$|Z_g| = \frac{|U_{pcch\_75Hz}|}{|I_{pcch\_75Hz}|}$$

$$\angle Z_g = \angle U_{pcch\_75Hz} - \angle I_{pcch\_75Hz}.$$

Step 1.4: Calculate the reference equivalent grid impedance $Z_{g\_est}$ according to the following equation according to the amplitude $|Z_g|$ of the grid impedance at the 75 Hz frequency and the phase $\angle Z_g$ of the grid impedance at the 75 Hz frequency in Step 1.3:

$$Z_{g\_est} = \frac{|Z_g| \cdot \sin\angle Z_g}{2\pi \cdot 75}$$

Figure 7:
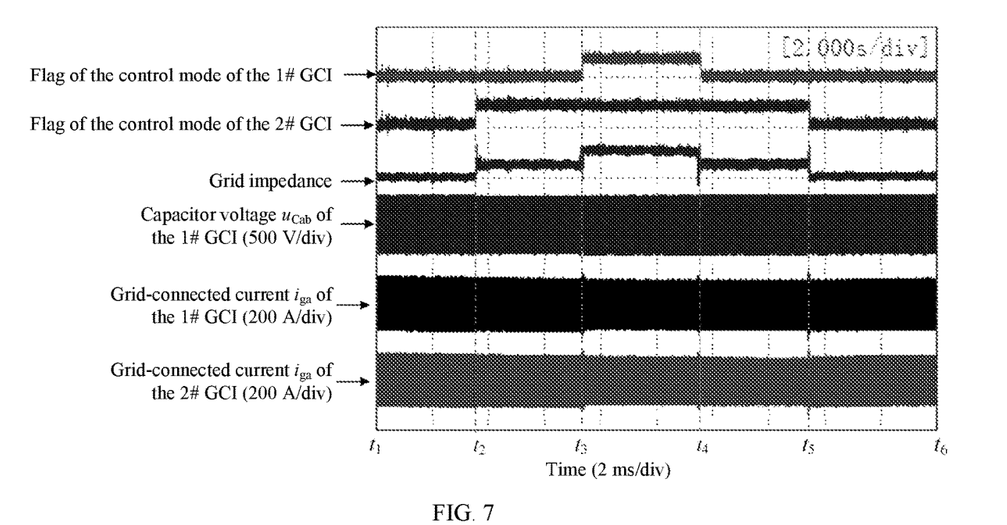
FIG. 7 illustrates an experimental waveform of a dual-mode combined control strategy for a multi-inverter system based on a double split transformer.
Figure 8:
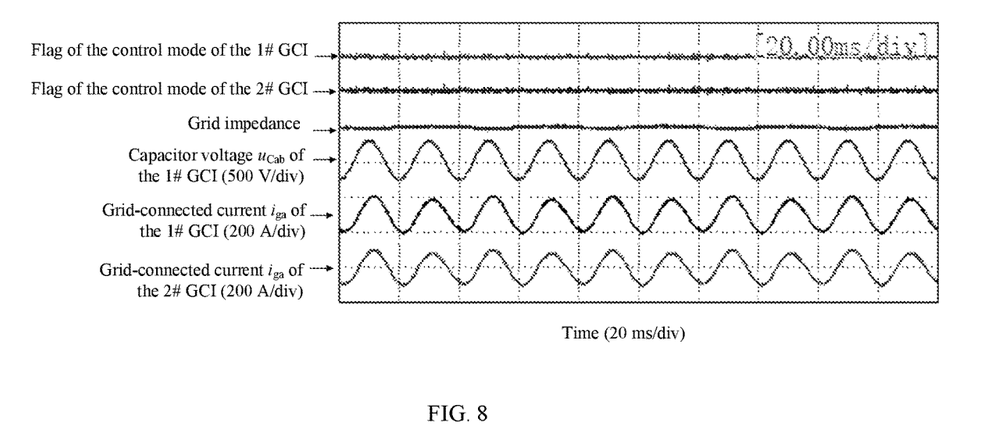
FIG. 8 illustrates an experimental waveform of a time period $t_1$-$t_2$ in FIG. 7.

In the embodiment of the present invention, FIG. 7 illustrates an experimental waveform of a dual-mode combined control strategy for a multi-inverter system based on a double split transformer. The experimental process is described as follows:

Time period $t_1$-$t_2$: the 0.2 mH inductor is connected to the system at the time $t_1$ to simulate the strong grid. According to the flow chart for implementation in FIG. 3, both the 1 #GCI and the 2 #GCI operate in the current source mode because of $Z_{g\_est} \leq \lambda_1=0.98$ mH. FIG. 8 illustrates an enlarged experimental waveform of the time period $t_1$-$t_2$ in FIG. 7. It can be seen that the grid current $i_{ga}$ and the capacitor voltage $u_{Cab}$ are stable, with the 75 Hz harmonics (which is the response obtained by injecting 75 Hz harmonics into the GCI using the grid impedance identification algorithm). In addition, the output of the grid impedance identification is 0.2 mH, and the flag of control modes of the 1 #GCI and the 2 #GCI are 0, indicating that the system operates in the full current source mode.

Figure 9:
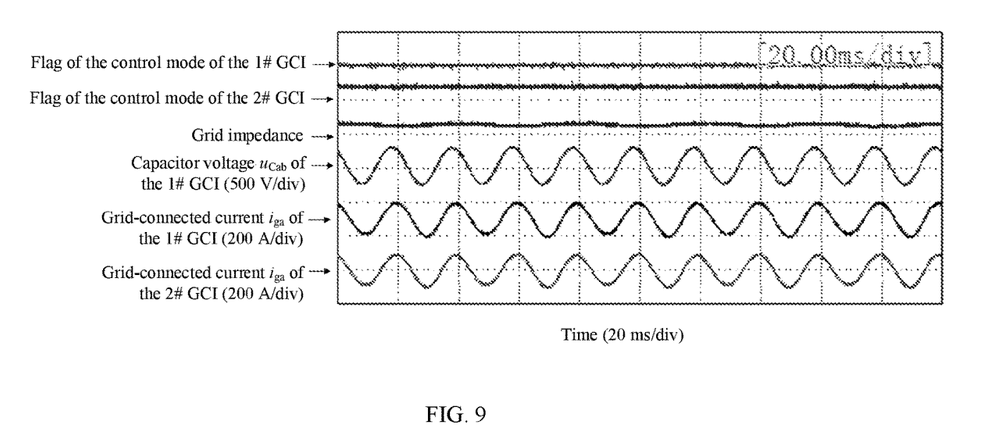
FIG. 9 illustrates an experimental waveform of a time period $t_2$-$t_3$ in FIG. 7.

Time period $t_2$-$t_3$: the 1 mH inductor is continuously put into the system at the time $t_2$ to simulate the weak grid. According to the flow chart for implementation in FIG. 3, the 2 #GCI operates in the voltage source mode, and the 1 #GCI still operates in the current source mode because of $\lambda_1=0.98$ mH$<Z_{g\_est} \leq \lambda_2=2$ mH. FIG. 9 illustrates an enlarged experimental waveform of the time period $t_2$-$t_3$ in FIG. 7. The grid current $i_{ga}$ and the capacitor voltage $u_{Cab}$ are still stable; and because of the grid impedance identification algorithm, there are 75 Hz harmonics in the voltage waveform and the current waveform. In addition, the output of the grid impedance identification is 1.2 mH, and the change of the grid impedance can be tracked in real time. The flag of control modes of the 1 #GCI and the 2 #GCI are 0 and 1 respectively, indicating that the system operates in the hybrid mode.

Figure 10:
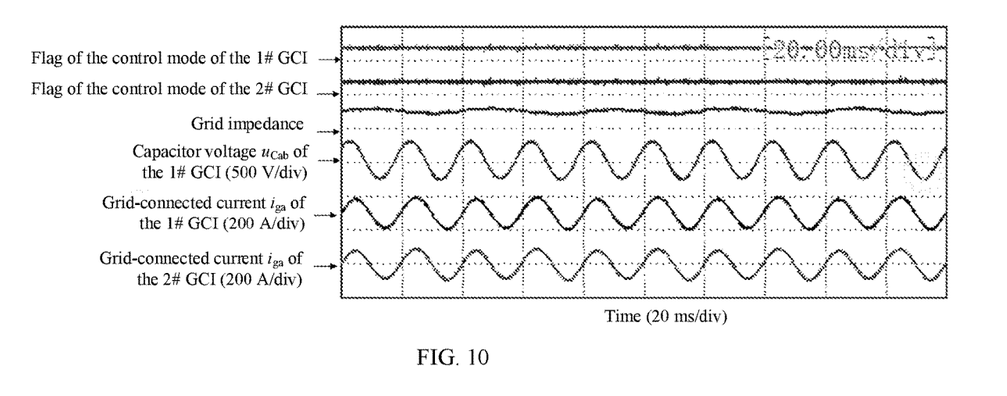
FIG. 10 illustrates an experimental waveform of a time period $t_3$-$t_4$ in FIG. 7.

Time period $t_3$-$t_4$: the 1.6 mH inductor is continuously put into the system at the time $t_3$ to simulate the extremely-weak grid. According to the flow chart for implementation in FIG. 3, both the 1 #GCI and the 2 #GCI operate in the voltage source mode because of $Z_{g\_est}>\lambda_2=2$ mH. FIG. 10 illustrates an enlarged experimental waveform of the time period $t_3$-$t_4$ in FIG. 7. The grid current $i_{ga}$ and the capacitor voltage $u_{Cab}$ are still stable; and because of the grid impedance identification algorithm, there are 75 Hz harmonics in the voltage waveform and the current waveform. In addition, the output of the grid impedance identification is 2.8 mH, and the change of the grid impedance can be tracked in real time. The flag of control modes of the 1 #GCI and the 2 #GCI are 1, indicating that the system operates in the full voltage source mode.

Time period $t_4$-$t_5$: the 1.6 mH inductor is continuously put into the system at the time $t_4$. Both the control strategy and the experimental waveform are the same as those in the time period $t_2$-$t_3$.

Time period $t_5$-$t_6$: the 1 mH inductor is continuously put into the system at the time $t_5$. Both the control strategy and the experimental waveform are the same as those in the time period $t_1$-$t_2$.

In conclusion, the experimental waveform in FIG. 7 is in good agreement with the flow chart for implementation in FIG. 3. The present invention is implemented simply, and greatly increases the stability margin of the multi-inverter system based on the double split transformer during the drastic fluctuation of the grid impedance; and particularly, the present invention ensures that the system can still operate stably in the extremely-weak grid, and makes the system more adaptable to the power grid.

What is claimed is:

1. A dual-mode combined control method for a multi-inverter system based on a double split transformer, wherein the multi-inverter system based on the double split transformer in the control method comprises two identical grid-connected inverters (GCIs), and the dual-mode combined control method comprises a full current source mode, a hybrid mode, and a full voltage source mode;

the control method comprises the following steps:
step 1: selecting a first GCI of the two identical GCIs from the multi-inverter system, labeling the first GCI as a 1 #GCI and a second GCI of the two identical GCIs as a 2 #GCI, acquiring an equivalent grid impedance at a point of common coupling (PCC) of the 1 #GCI with a grid impedance identification algorithm, and labeling the equivalent grid impedance as a reference equivalent grid impedance $Z_{g\_est}$; and
step 2: setting a lower boundary value $\lambda_1$ of the equivalent grid impedance and an upper boundary value $\lambda_2$ of the equivalent grid impedance, and performing the following determinations and operations according to the reference equivalent grid impedance $Z_{g\_est}$ in step 1:
determining, in response to $Z_{g\_est} \leq \lambda_1$, that a power grid is in a strong grid state, setting the multi-inverter system to operate in the full current source mode, and ending a control process;
determining, in response to $\lambda_1 < Z_{g\_est} \leq \lambda_2$, that the power grid is in a weak grid state, setting the multi-inverter system to operate in the hybrid mode, and ending the control process; and
determining, in response to $Z_{g\_est} > \lambda_2$, that the power grid is in an extremely-weak grid state, setting the multi-inverter system to operate in the full voltage source mode, and ending the control process; and
the full current source mode comprises the two identical GCIs operating in a current source mode; the hybrid mode comprises the first GCI operating in the current source mode, and the second GCI operating in a voltage source mode; the full voltage source mode comprises the two identical GCIs operating in the voltage source mode; and each of the two identical GCIs is a three-phase full-bridge GCI.

2. The dual-mode combined control method for the multi-inverter system based on the double split transformer according to claim 1, wherein the current source mode comprises the following control steps:
step 2.1: sampling output grid-connected currents $i_{ga}$, $i_{gb}$, $i_{gc}$, and sampling PCC voltages $u_{pcca}$, $u_{pccb}$, $u_{pccc}$;
step 2.2: obtaining, according to the sampled PCC voltages $u_{pcca}$, $u_{pccb}$, $u_{pccc}$ in step 2.1, dq-axis components $u_{pccd}$, $u_{pccq}$ for the PCC voltages through a transformation equation from a three-phase static coordinate system to a two-phase rotating coordinate system; and obtaining a phase angle $\theta$ of each of the PCC voltages $u_{pcca}$, $u_{pccb}$, $u_{pccc}$ through a phase-locked loop (PLL),
a transformation equation for transforming the PCC voltages from the three-phase static coordinate system to the two-phase rotating coordinate system being:

$$u_{pccd} = \frac{2}{3}\left[u_{pcca}\cos\theta + u_{pccb}\cos\left(\theta - \frac{2\pi}{3}\right) + u_{pccc}\cos\left(\theta + \frac{2\pi}{3}\right)\right]$$

$$u_{pccq} = -\frac{2}{3}\left[u_{pcca}\sin\theta + u_{pccb}\sin\left(\theta - \frac{2\pi}{3}\right) + u_{pccc}\sin\left(\theta + \frac{2\pi}{3}\right)\right]$$

and
an equation for calculating the phase angle $\theta$ of each of the PCC voltages being:

$$\theta = \frac{\omega_0 - (K_{p\_PLL} + K_{i\_PLL}/s) \cdot u_{pccq}}{s}$$

wherein, $\omega_0$ is a rated angular frequency of each of the PCC voltages, $K_{p\_PLL}$ is a proportional coefficient of a proportional-integral (PI) controller in the PLL, $K_{i\_PLL}$ is an integral coefficient of the PI controller in the PLL, and s is a Laplace operator;
step 2.3: transforming, according to the phase angle $\theta$ of each of the PCC voltages in step 2.2, the output grid-connected currents $i_{ga}$, $i_{gb}$, $i_{gc}$ sampled in step 2.1 into dq-axis components $i_{gd}$, $i_{gq}$ for the output grid-connected currents in the two-phase rotating coordinate system through the transformation equation from the three-phase static coordinate system to the two-phase rotating coordinate system,
a transformation equation for transforming the output grid-connected currents from the three-phase static coordinate system to the two-phase rotating coordinate system being:

$$i_{gd} = \frac{2}{3}\left[i_{ga}\cos\theta + i_{gb}\cos\left(\theta - \frac{2\pi}{3}\right) + i_{gc}\cos\left(\theta + \frac{2\pi}{3}\right)\right]$$

$$i_{gq} = -\frac{2}{3}\left[i_{ga}\sin\theta + i_{gb}\sin\left(\theta - \frac{2\pi}{3}\right) + i_{gc}\sin\left(\theta + \frac{2\pi}{3}\right)\right]$$

step 2.4: setting reference signals $i_{gdref}$, $i_{gqref}$ for the output grid-connected currents, and obtaining control signals $u_d$, $u_q$ through a grid current closed-loop control equation according to the dq-axis components $i_{gd}$, $i_{gq}$ for the output grid-connected currents in step 2.3,
the grid current closed-loop control equation being:

$$u_d = \left(K_p + \frac{K_i}{s}\right) \cdot (i_{gdref} - i_{gd})$$

$$u_q = \left(K_p + \frac{K_i}{s}\right) \cdot (i_{gqref} - i_{gq})$$

wherein, $K_p$ is a proportional coefficient of a PI controller in the grid current closed-loop control equation, and $K_i$ is an integral coefficient of the PI controller in the grid current closed-loop control equation;
step 2.5: transforming, according to the phase angle $\theta$ of each of the PCC voltages in step 2.2, the control signals $u_d$, $u_q$ in step 2.4 into components $u_a$, $u_b$, $u_c$ for the control signals in the three-phase static coordinate system through a transformation equation from the two-phase rotating coordinate system to the three-phase static coordinate system, a transformation equation for transforming the control signals from the two-phase rotating coordinate system to the three-phase static coordinate system being:

$$u_a = u_d\cos\theta - u_q\sin\theta$$

$$u_b = u_d\cos\left(\theta - \frac{2\pi}{3}\right) - u_q\sin\left(\theta - \frac{2\pi}{3}\right)$$

$$u_c = u_d\cos\left(\theta + \frac{2\pi}{3}\right) - u_q\sin\left(\theta + \frac{2\pi}{3}\right)$$

and step 2.6: adding the components $u_a$, $u_b$, $u_c$ in the three-phase static coordinate system in step 2.5 and the PCC voltages $u_{pcca}$, $u_{pccb}$, $u_{pccc}$ in step 2.1, respectively, to obtain bridge arm voltage control signals $u_a+u_{pcca}$, $u_b+u_{pccb}$, $u_c+u_{pccc}$ of the three-phase full-bridge GCI, performing a space vector pulse width modulation (SVPWM) to generate a switching signal for a power device of the three-phase full-bridge GCI, and controlling connection and disconnection of the power device of the three-phase full-bridge GCI through a driving circuit.

3. The dual-mode combined control method for the multi-inverter system based on the double split transformer according to claim 1, wherein the voltage source mode comprises the following control steps:

step 3.1: sampling output grid-connected currents $i_{ga}$, $i_{gb}$, $i_{gc}$, and sampling PCC voltages $u_{pcca}$, $u_{pccb}$, $u_{pccc}$;

step 3.2: obtaining, according to the output grid-connected currents $i_{ga}$, $i_{gb}$, $i_{gc}$ sampled in step 3.1, $\alpha\beta$-axis components $i_{g\alpha}$, $i_{g\beta}$ for the output grid-connected currents through a transformation equation from a three-phase static coordinate system to a two-phase static coordinate system; and obtaining, according to the PCC voltages $u_{pcca}$, $u_{pccb}$, $u_{pccc}$ sampled in step 3.1, $\alpha\beta$-axis components $u_{pcc\alpha}$, $u_{pcc\beta}$ for the PCC voltages through the transformation equation from the three-phase static coordinate system to the two-phase static coordinate system, a transformation equation for transforming the output grid-connected currents from the three-phase static coordinate system to the two-phase static coordinate system being:

$$i_{g\alpha} = \frac{2}{3}\left(i_{ga} - \frac{1}{2}i_{gb} - \frac{1}{2}i_{gc}\right)$$

$$i_{g\beta} = \frac{2}{3}\left(\frac{\sqrt{3}}{2}i_{gb} - \frac{\sqrt{3}}{2}i_{gc}\right)$$

and a transformation equation for transforming the PCC voltages from the three-phase static coordinate system to the two-phase static coordinate system being:

$$u_{pcc\alpha} = \frac{2}{3}\left(u_{pcca} - \frac{1}{2}u_{pccb} - \frac{1}{2}u_{pccc}\right)$$

$$u_{pcc\beta} = \frac{2}{3}\left(\frac{\sqrt{3}}{2}u_{pccb} - \frac{\sqrt{3}}{2}u_{pccc}\right)$$

step 3.3: according to the $\alpha\beta$-axis components $i_{g\alpha}$, $i_{g\beta}$ for the output grid-connected currents and the $\alpha\beta$-axis components $u_{pcc\alpha}$, $u_{pcc\beta}$ for the PCC voltages in step 3.2, obtaining an average active power $\overline{P}$ through an equation for calculating the average active power, and obtaining an average reactive power $\overline{Q}$ through an equation for calculating the average reactive power, the equation for calculating the average active power being:

$$\overline{P} = \frac{1.5}{\tau s + 1}(u_{pcc\alpha}i_{g\alpha} + u_{pcc\beta}i_{g\beta})$$

and the equation for calculating the average reactive power being:

$$\overline{Q} = \frac{1.5}{\tau s + 1}(u_{pcc\alpha}i_{g\beta} - u_{pcc\beta}i_{g\alpha})$$

wherein, $\tau$ is a time constant of a first-order low-pass filter, and s is a Laplace operator;

step 3.4: obtaining, according to the average active power $\overline{P}$ in step 3.3, an output angular frequency $\omega$ of the three-phase full-bridge GCI through an active power-frequency droop control equation, the active power-frequency droop control equation being:

$$\omega = \omega_n + D_p(P_n - \overline{P})$$

where, $P_n$ is a given active power reference of the three-phase full-bridge GCI, $\omega_n$ is a rated angular frequency of the three-phase full-bridge GCI corresponding to the given active power reference $P_n$, and $D_p$ is a droop coefficient of an active power loop; and integrating the output angular frequency $\omega$ of the three-phase full-bridge GCI to obtain an output phase angle $\theta_0$ of the three-phase full-bridge GCI by the following equation:

$$\theta_0 = \frac{\omega}{s}$$

step 3.5: obtaining, according to the PCC voltages $u_{pcca}$, $u_{pccb}$, $u_{pccc}$ sampled in step 3.1, and the output phase angle $\theta_0$ of the three-phase full-bridge GCI in step 3.4, dq-axis components $u_{pccd}$, $u_{pccq}$ for the PCC voltages through a transformation equation from the three-phase static coordinate system to a two-phase rotating coordinate system, a transformation equation for transforming the PCC voltages from the three-phase static coordinate system to the two-phase rotating coordinate system being:

$$u_{pccd} = \frac{2}{3}\left[u_{pcca}\cos\theta_0 + u_{pccb}\cos\left(\theta_0 - \frac{2\pi}{3}\right) + u_{pccc}\cos\left(\theta_0 + \frac{2\pi}{3}\right)\right]$$

-continued
$$u_{pccq} = -\frac{2}{3}\left[u_{pcca}\sin\theta_0 + u_{pccb}\sin\left(\theta_0 - \frac{2\pi}{3}\right) + u_{pccc}\sin\left(\theta_0 + \frac{2\pi}{3}\right)\right]$$

step 3.6: obtaining, according to the output grid-connected currents $i_{ga}$, $i_{gb}$, $i_{gc}$ sampled in step 3.1, and the output phase angle $\theta_0$ of the three-phase full-bridge GCI in step 3.4, dq-axis components $i_{gd}$, $i_{gq}$ for the output grid-connected currents through the transformation equation from the three-phase static coordinate system to the two-phase rotating coordinate system, a transformation equation for transforming the output grid-connected currents from the three-phase static coordinate system to the two-phase rotating coordinate system being:

$$i_{gd} = \frac{2}{3}\left[i_{ga}\cos\theta_0 + i_{gb}\cos\left(\theta_0 - \frac{2\pi}{3}\right) + i_{gc}\cos\left(\theta_0 + \frac{2\pi}{3}\right)\right]$$

$$i_{gq} = -\frac{2}{3}\left[i_{ga}\sin\theta_0 + i_{gb}\sin\left(\theta_0 - \frac{2\pi}{3}\right) + i_{gc}\sin\left(\theta_0 + \frac{2\pi}{3}\right)\right]$$

step 3.7: obtaining, according to the output average reactive power $\overline{Q}$ of the three-phase full-bridge GCI in step 3.3, reference values $u_{pccdref}$, $u_{pccqref}$ of the dq-axis components for the PCC voltages of the three-phase full-bridge GCI through a reactive power-amplitude droop control equation, the reactive power-amplitude droop control equation being:

$$u_{pccdref} = U_n + D_q(Q_n - \overline{Q})$$

$$u_{pccqref} = 0$$

wherein, $U_n$ is a rated output voltage of the three-phase full-bridge GCI corresponding to a given reactive power reference $Q_n$, and $D_q$ is a droop coefficient of a reactive power loop;

step 3.8: obtaining reference signals $i_{gdref}$, $i_{gqref}$ for the output grid-connected currents through a voltage loop control equation according to the dq-axis components $u_{pccd}$, $u_{pccq}$ for the PCC voltages in step 3.5 and the reference values $u_{pccdref}$, $u_{pccqref}$ of the dq-axis components for the PCC voltages in step 3.7;

the voltage loop control equation being:

$$i_{gdref} = \left(K_{p1} + \frac{K_{i1}}{s}\right)\cdot(u_{pccdref} - u_{pccd})$$

$$i_{gqref} = \left(K_{p1} + \frac{K_{i1}}{s}\right)\cdot(u_{pccqref} - u_{pccq})$$

wherein, $K_{p1}$ is a proportional coefficient of a PI controller in the voltage loop control equation, and $K_{i1}$ is an integral coefficient of the PI controller in the voltage loop control equation;

step 3.9: obtaining control signals $u_d$, $u_q$ through a current loop control equation according to the reference signals $i_{gdref}$, $i_{gqref}$ for the output grid-connected currents in step 3.8 and the dq-axis components $i_{gd}$, $i_{gq}$ for the output grid-connected currents in step 3.6, the current loop control equation being:

$$u_d = \left(K_{p2} + \frac{K_{i2}}{s}\right)\cdot(i_{gdref} - i_{gd})$$

$$u_q = \left(K_{p2} + \frac{K_{i2}}{s}\right)\cdot(i_{gqref} - i_{gq})$$

wherein, $K_{p2}$ is a proportional coefficient of a PI controller in the current loop control equation, and $K_{i2}$ is an integral coefficient of the PI controller in the current loop control equation;

step 3.10: transforming, according to the output phase angle $\theta_0$ of the three-phase full-bridge GCI in step 3.4, the control signals $u_d$, $u_q$ in step 3.9 into components $u_a$, $u_b$, $u_c$ for the control signals in the three-phase static coordinate system through a transformation equation from the two-phase rotating coordinate system to the three-phase static coordinate system, a transformation equation for transforming the control signals from the two-phase rotating coordinate system to the three-phase static coordinate system being:

$$u_a = u_d\cos\theta_0 - u_q\sin\theta_0$$

$$u_b = u_d\cos\left(\theta_0 - \frac{2\pi}{3}\right) - u_q\sin\left(\theta_0 - \frac{2\pi}{3}\right)$$

$$u_c = u_d\cos\left(\theta_0 + \frac{2\pi}{3}\right) - u_q\sin\left(\theta_0 + \frac{2\pi}{3}\right)$$

and step 3.11: adding the components $u_a$, $u_b$, $u_c$ in the three-phase static coordinate system in step 3.10 and the PCC voltages $u_{pcca}$, $u_{pccb}$, $u_{pccc}$ in step 3.1, respectively, to obtain bridge arm voltage control signals $u_a + u_{pcca}$, $u_b + u_{pccb}$, $u_c + u_{pccc}$ of the three-phase full-bridge GCI, generating switching signals for a power device of the three-phase full-bridge GCI through a space vector pulse width modulation (SVPWM), and controlling opening and closing of the power device of the three-phase full-bridge GCI through a driving circuit.

* * * * *